United States Patent [19]

Hinks

[11] Patent Number: 5,168,226
[45] Date of Patent: Dec. 1, 1992

[54] ACQUISITION OF MULTIPLE IMAGES IN FAST SPIN ECHO NMR SCANS

[75] Inventor: Richard S. Hinks, Waukesha, Wis.

[73] Assignee: General Electric, Milwaukee, Wis.

[21] Appl. No.: 703,990

[22] Filed: May 22, 1991

[51] Int. Cl.$^5$ ............................................ G01R 33/20
[52] U.S. Cl. .................................... 324/309; 324/307
[58] Field of Search ................. 324/309, 307, 300, 312

[56] References Cited

U.S. PATENT DOCUMENTS

| | | | |
|---|---|---|---|
| 4,521,733 | 6/1985 | Bottomley et al. | 324/307 |
| 4,734,646 | 3/1988 | Shenoy et al. | 324/309 |
| 4,818,940 | 4/1989 | Hennig et al. | 324/309 |
| 4,820,984 | 4/1989 | Kuhn et al. | 324/309 |
| 4,881,033 | 11/1989 | Denison et al. | 324/309 |
| 4,901,020 | 2/1990 | Ladebeck et al. | 324/309 |

OTHER PUBLICATIONS

Hennig, Nauerth & Friedburg, "RARE" Imaging: A Fast Imaging Method for Clinical MR, (1986), pp. 823–833.

Mulkern, Wong, Winalski & Jolesz, "contrast Manuiplation and Artifact Assesment of 2D and 3D RARE Sequences", (1990), pp. 557–566.

Higuchi, Oshio, Momoshima, Shiga Melki, Mulkern & Jolesz, "Two-Contrast RARE: A Fast Spin-Density and T2-Weighted Imaging Method", (1991), p. 147.

*Primary Examiner*—Michael J. Tokar
*Assistant Examiner*—Raymond Y. Mah
*Attorney, Agent, or Firm*—Quarles & Brady

[57] ABSTRACT

An NMR imaging system executes a series of fast spin echo pulse sequences to acquire data for a plurality of images having different $T_2$-weighted contrast. Only low-order phase encoding data is acquired separately for each image and the scan time is reduced substantially by using common high-order phase encoding data for all the images.

6 Claims, 4 Drawing Sheets

ACQUISITION OF MULTIPLE IMAGES IN FAST SPIN ECHO NMR SCANS

BACKGROUND OF THE INVENTION

The field of the invention is nuclear magnetic resonance imaging methods and systems. More particularly, the invention relates to the acquisition of multiple images in fast spin echo NMR scans.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_O$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_z$ is tipped, and hence the magnitude of the net transverse magnetic moment $M_t$ depends primarily on the length of time and the magnitude of the applied excitation field $B_1$.

The practical value of this phenomenon resides in the signal which is emitted by the excited spins after the excitation signal $B_1$ is terminated. In simple systems the excited spins induce an oscillating sine wave signal in a receiving coil. The frequency of this signal is the Larmor frequency, and its initial amplitude, $A_O$, is determined by the magnitude of the transverse magnetic moment $M_t$. The amplitude, A, of the emission signal decays in an exponential fashion with time, t:

$$A = A_O e^{-t/T^*_2}$$

The decay constant $1/T^*_2$ depends primarily on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would irreversibly dephase after removal of the excitation signal $B_1$ in a perfectly homogeneous field.

Another important factor which contributes to the amplitude A of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more excitation pulses ($B_1$) of varying magnitude, duration, and direction. Such excitation pulses may have a narrow frequency spectrum (selective excitation pulse), or they may have a broad frequency spectrum (nonselective excitation pulse) which produces transverse magnetization $M_t$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_O$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques. Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal.

The concept of acquiring NMR image data in a short time period has been know since 1977 when the echo-planar pulse sequence was proposed by Peter Mansfield (J. Phys. C.10: L55-L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds or so in duration. The advantages of echo-planar imaging ("EPI") are well-known, and variations on this pulse sequence are disclosed in U.S. Pat. Nos. 4,678,996; 4,733,188; 4,716,369; 4,355,282; 4,588,948; and 4,752,735.

A variant of the echo planar imaging method is the Rapid Acquisition Relaxation Enhanced (RARE) sequence which is described by J. Hennig et al in an article in *Magnetic Resonance In Medicine* 3,823-833 (1986) entitled "RARE Imaging: A Fast Imaging Method for Clinical MR." The essential difference between the RARE sequence and the EPI sequence lies in the manner in which echo signals are produced. The RARE sequence utilizes RF refocused echoes generated from a Carr-Purcell-Meiboom-Gill sequence, while EPI methods employ gradient recalled echoes. Both of these "fast spin echo" imaging methods involve the acquisition of multiple spin echo signals from a single excitation pulse in which each acquired echo signal is separately phase encoded. Each pulse sequence, or "shot", therefore results in the acquisition of a plurality of views, and single shot scans are commonly employed with the EPI method. However, a plurality of shots are typically employed to acquire a complete set of image data when the RARE fast spin echo sequence is employed. For example, a RARE pulse sequence might acquire 8 or 16 separate echo signals, per shot, and an image requiring 256 views would, therefore, require 32 or 16 shots respectively.

In clinical applications of fast spin echo imaging sequences, more than one image is often acquired during a single scan. The images depict the same structures in the patient, but different structures are enhanced in each image by employing $T_2$-weighted effects. For example, one image of a joint may be reconstructed from early echo signals in each shot to provide enhancement of structures having a short $T_2$ decay, such as muscle tissue. The second image may be reconstructed from later echo signals in each shot to provide enhancement of structures having a longer $T_2$ decay, such as joint fluid. Such multi-image fast spin echo imaging sequences are described by N. Higuchi et al in an abstract in *Journal of Magnetic Resonance Imaging*, Vol. 1, No. 2, pg. 147, 1991 entitled "Two-Contrast RARE: A Fast Spin-Density and $T_2$-Weighted Imaging Method." It should be apparent that when additional images are acquired during a scan, more spin echo signals must be acquired and the length of the scan is increased proportionately.

SUMMARY OF THE INVENTION

The present invention relates to an improvement in a multiple image, fast spin echo NMR scan which reduces the total number of views that must be acquired to reconstruct the multiple images and to thereby shorten the total scan time. More specifically, the invention includes an NMR system for executing a fast spin echo pulse sequence in which a plurality of views are acquired and the fast spin echo pulse sequence is employed to acquire views from a plurality of separate images during a scan. The low-order phase encoding views are acquired for each image and stored in separate image data arrays, whereas the high-order phase encoding views are acquired only once and stored in all of the image data arrays. Each image data array is employed to reconstruct a separate image using standard reconstruction methods and apparatus.

A general object of the invention is to shorten the scan time required to acquire NMR data for multiple images using a fast spin echo pulse sequence. It has been discovered that not all of the views need be acquired for each of the images to obtain the desired $T_2$ contrast between the images. Instead, the desired $T_2$ contrast s produced primarily by the low-order views of each image and the high-order views enhance the structural details of each image. Accordingly, only the low-order views need be acquired separately for each image to provide the desired $T_2$ contrast, and a single set of high-order phase encoding views can be used to fill in the structure details in all of the images.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
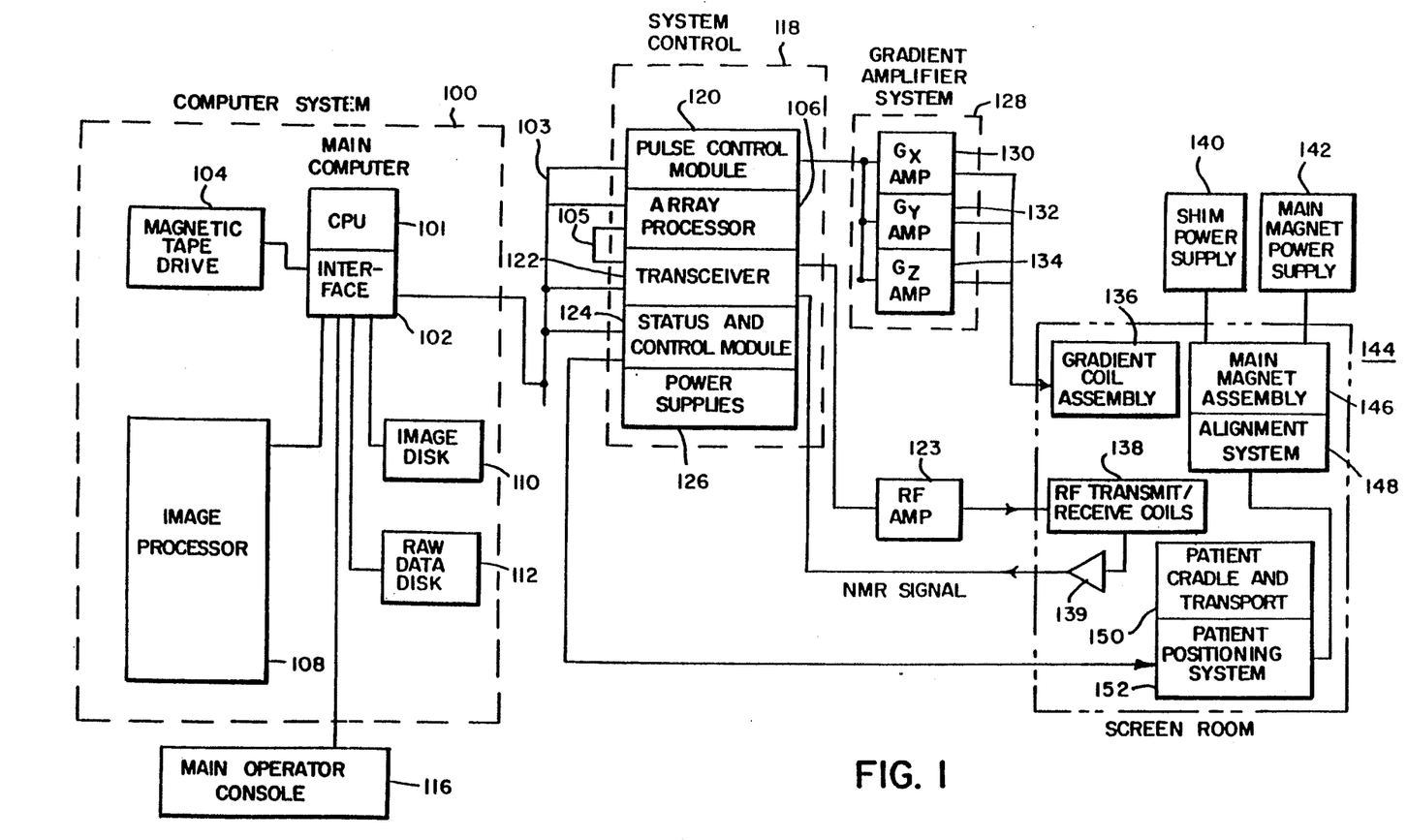
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNAL". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image professor 108 is to provide interactive image display manipulation such as magnification, image comparison, gray-scale adjustment and real-time data display. The computer system is provided with a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 36 and which is part of a magnet assembly 146. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_O$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x,y,z) is given by $B(x,y,z) = B_O + G_x X + G_y Y + G_z Z$.

The gradient magnetic fields are utilized in combination with radio frequency pulses generated by transceiver 122, RF amplifier 128 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize shim coil associated with the main magnet and which are used to correct inhomogeneities in the polarizing magnet field. In the case of a resistive magnet, main magnet power supply 142 is utilized to continuously energize the magnet. In the case of a superconductive magnet, the main power supply 142 is utilized to bring the polarizing field produced by the magnet to the proper operating strength and is then disconnected. In the case of a permanent magnet, power supply 142 operates in needed. The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient-handling devices, are enclosed in an RF-shielded room generally designated 144.

Figure 2:
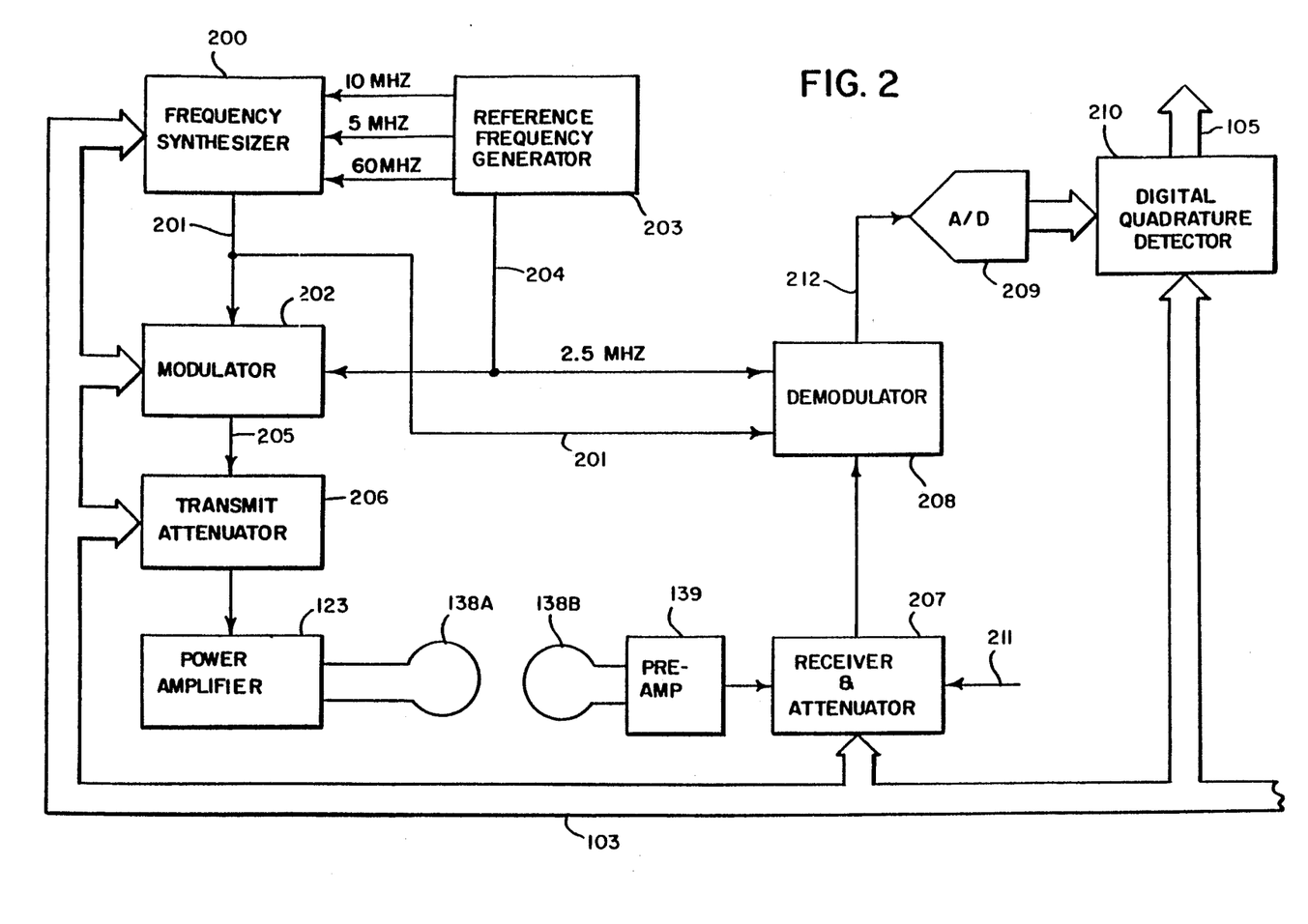
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF Carrier is applied to a modulator 202 where it is modulated in response to a signal R(t) received through bus 103 from the PCM 120. The signal R(t) defines the envelope, and therefore the bandwidth, of the RF excitation pulse to be produced. It is produced in the PCM 120 by sequentially reading out a series of stored digital values as the RF excitation pulse is produced that represent the desired envelope. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature Q)

values corresponding to the received digital signal. The resulting stream of digitized I and Q values of the received NMR signal is output through bus 105 to the array where they are employed to reconstruct an image.

To preserve the phase information in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
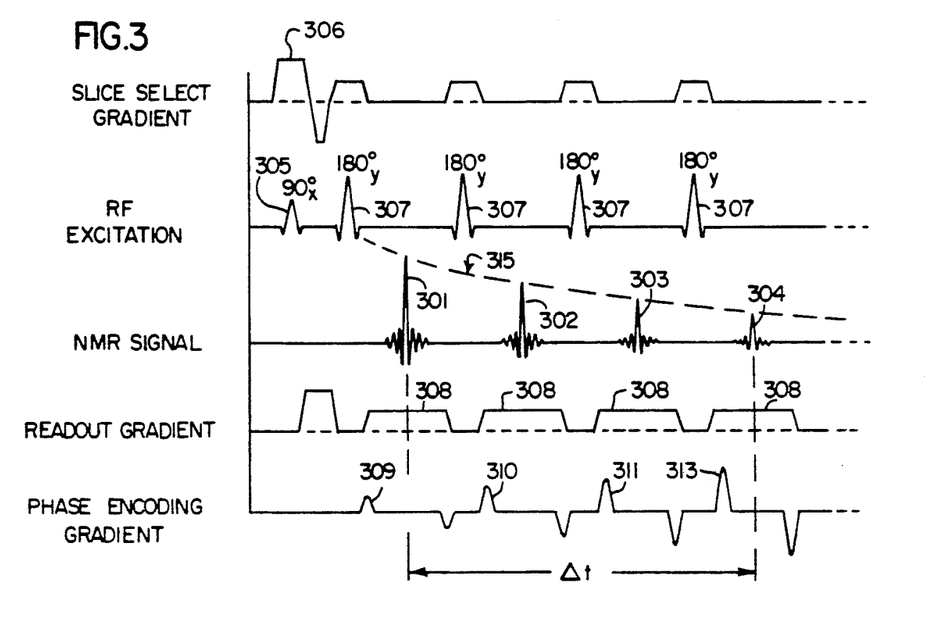
FIG. 3 is a graphic representation of a preferred 2DFT fast spin echo pulse sequence employed by the system of FIG. 1 to practice the present invention.

Referring particularly to FIG. 3, the fast spin echo NMR pulse sequence employed to practice the preferred embodiment of the invention is a 2DFT RARE sequence in which sixteen NMR echo signals are acquired. For clarity, only four echo signals 301-304 are shown in FIG. 3, but it can be appreciated that twelve more are produced and acquired. These NMR echo signals are produced by a 90° RF excitation pulse 305 which is generated in the presence of a $G_z$ slice select gradient pulse 306 to provide transverse magnetization in a slice through the patient. This transverse magnetization is refocused by each of sixteen selective 180° RF echo pulses 307 to produce the NMR spin echo signals 301-304 that are acquired in the presence of $G_x$ readout gradient pulses 308. Each NMR spin echo signal 301-304 is separately phase encoded by respective $G_y$ phase encoding pulses 309-313. The magnitude of each phase encoding pulse is different, and it is stepped through 256 values to acquire 256 separate views during a complete scan. This enables an image having 256 separate pixels in the y direction to be reconstructed. Each NMR spin echo signal is acquired by digitizing 256 samples of each signal. As a result, at the completion of a scan for one image, 16 shots (256/16 = 16) of the pulse sequence of FIG. 3 have been executed and a 256 by 256 element array of complex numbers have been acquired An image is reconstructed by performing a 2D Fourier transformation on this image data array and then calculating the absolute value of each resulting complex element. A 256 by 256 pixel image is thus produced in which the brightness of each pixel is determined by the magnitude of its corresponding element in the transformed array.

Referring still to FIG. 3, the $T_2$ decay in the NMR spin echo signals 301-304 is illustrated by the dashed line 315. The rate of decay is different for different tissue types and a common strategy in NMR imaging is to enhance the contrast in certain tissues over other tissues by judiciously selecting an effective echo time which is determined primarily by the actual echo time (TE) of the central, or low-order, views that dominate image contrast. For example, to enhance muscle tissue in the image of a human knee joint, the first spin echo signals may be encoded to a low-order phase encoding value in each shot because the $T_2$ decay rate of muscle tissue is high and the shortest possible effective echo time (TE) is desired. On the other hand, to produce an image in which the fluids in the knee joint are enhanced, the low-order phase encoding views may be acquired from later echo signals which have a much longer echo time TE. The $T_2$ decay rate of joint fluids is much less than that of muscle tissue, and as a result, these fluids will contribute proportionately more signal and their contrast will be enhanced in comparison with that of muscle tissue. It is common clinical practice, therefore, to acquire data for a number of images, with each image having a different "$T_2$-weighting" to enhance the contrast of different tissue types. One method for acquiring a plurality of images with different effective TE echo times is to acquire multiple image data sets in a single scan as is commonly done in conventional spin echo imaging.

It should be apparent that for each of the plurality of images which are to be produced during a scan, an image data array must be acquired having the number of elements, or samples, that will yield an image of the desired resolution. In the preferred embodiment a 256 by 256 element image data array is required, and as described above, this requires sixteen shots using the fast spin echo sequence of FIG. 3 to acquire a single image. In prior NMR systems, an additional sixteen shots are required for each additional image that is to be produced during the scan. For two images, therefore, thirty-two shots are required and the scan time is doubled.

The present invention enables additional images to be produced without a proportionate increase in total scan time. It has been discovered that $T_2$-weighted contrast in an NMR image is determined primarily by the low-order phase encoding views and that it is not necessary, therefore, to duplicate the acquisition of the high-order phase encoding views when two or more images are being acquired. In other words, in a fast spin echo scan which acquires two or more images of different $T_2$-weighting, only a set of low-order phase encoding views need be acquired separately for each image reconstruction. A single set of high-order views can be acquired and the data shared among all of the image data sets.

Figure 4:
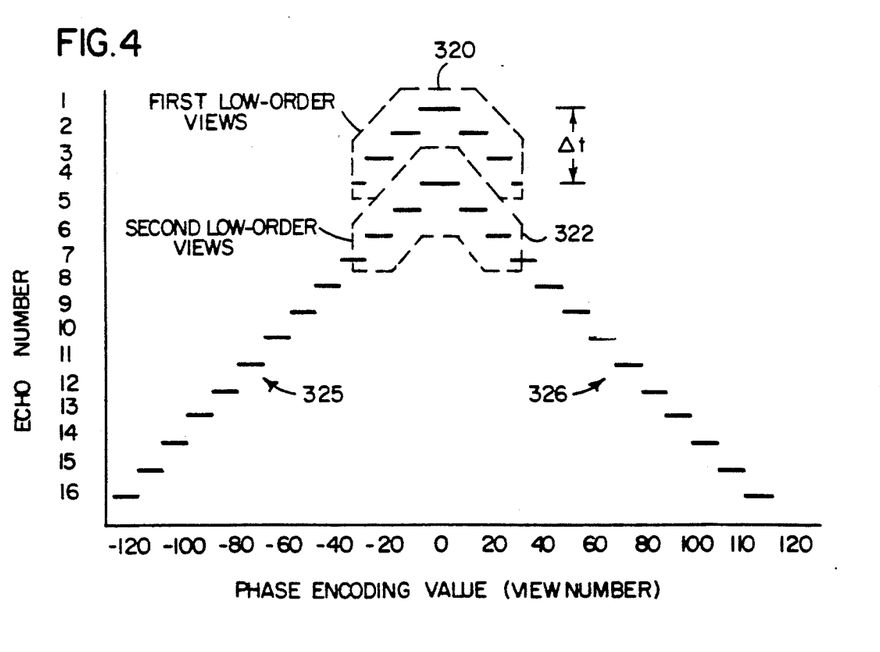
FIG. 4 is a graphic representation o the order of the phase encoding views that are acquired during a scan which employs the pulse sequence of FIG. 3.
Figure 5:
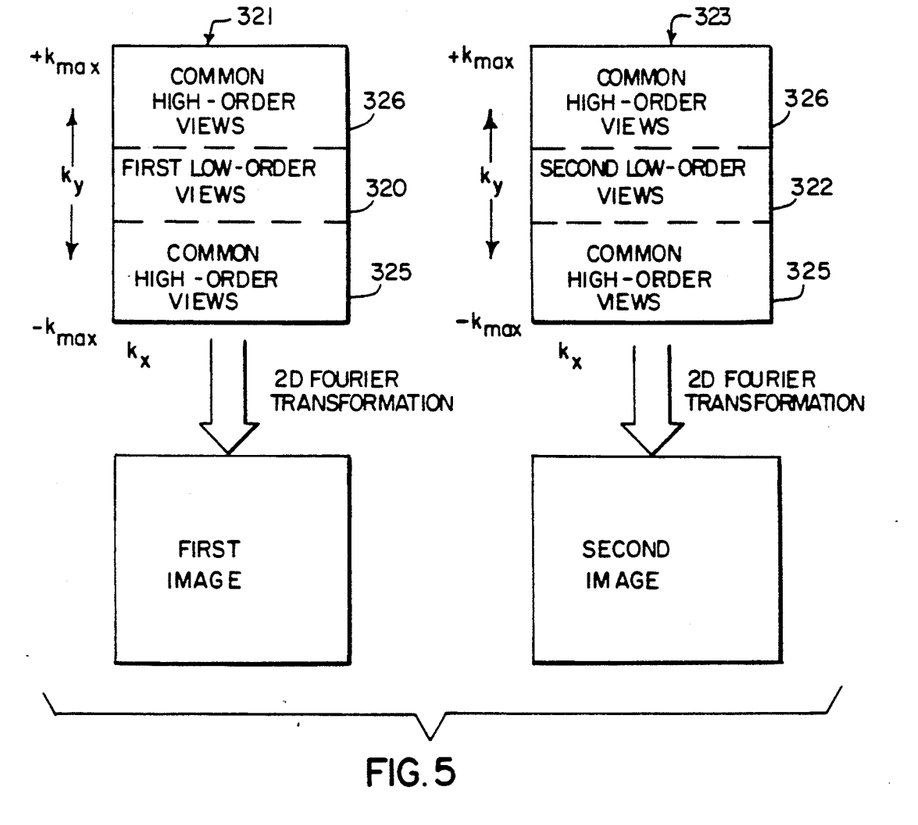
FIG. 5 is a schematic representation of the NMR data which is acquired, during the scan and which is employed to reconstruct separate images accordingly to the present invention.

Such a scan in which data for two 256 by 256 pixel images is acquired is illustrated in FIGS. 4 and 5. The pulse sequence of FIG. 3 is repeated twenty times and sixteen NMR spin echo signals are acquired during each pulse sequence for a total of 16×20=320 phase encoding views. Sixty-four of these views which are identified by the dashed line 320 contain low-order ($-32 \leq k_y +32$) phase encoding and are stored in an NMR data array 321 and used to construct a first image. Another sixty-four views which are identified by the dashed line 322 contain low-order phase encoding for a second image and are stored in a separate NMR data array 323 used to construct the second image. As seen clearly in FIG. 4, the first set of low-order views are acquired from the first through fourth spin echo signals as indicated along the vertical axis, and the second set of low-order views are acquired from the fourth through seventh spin echo signals produced during the scan. The difference in the $T_2$-weighting of the resulting images is determined primarily by the time difference Δt between the first and fourth spin echo signals. The remaining high-order views (256−64=192) are acquired once during the scan. These include 96 views ($-128 \leq k_y \leq -33$) indicated at 325 which are stored in both image data arrays 321 and 323, and 96 views ($33 \leq k_y \leq 128$) indicated at 326 Which are also stored in both image data arrays 321 and 323. As a result, two 256 by 256 image data arrays 321 and 323 are filled with acquired data when the scan is completed.

The two images are reconstructed from the data in the two arrays 321 and 323 in the usual manner. In the preferred embodiment this reconstruction is accomplished by performing a two-dimensional complex Fourier transformation of each array of data, first in the row, or readout direction, and then in the column, or phase encoding direction. The magnitude of each resulting complex number is then calculated and used to control the brightness of a pixel in the first and second images.

It should be apparent that many variations are possible from the specific scan illustrated and described above. Referring to FIG. 4, for example, different $T_2$-weighted contrasts between the two images can be achieved simply by acquiring the separate low-order views during different spin echo signals. In other words, the views within dashed lines 320 and 322 can be moved vertically on the graph in FIG. 4 to provide the desired $T_2$-weighting and the desired difference $\Delta t$. Also, the method can be easily extended to acquire data for additional images merely by acquiring a third or more sets of low-order views.

In the preferred embodiment sixty-four out of a total 256 views are separately acquired for each image. This has been found to provide the desired difference, or contrast between the images while requiring only a 25% increase in total scan time (i.e. 320 views instead of 512). Images of sufficient contrast have also been produced with even fewer low-order views, while in some clinical applications more low-order views may be required. It is contemplated that clinical applications of the present invention will require that anywhere from one-eighth to one-half of the total phase encoding views be separately acquired for each image.

Figure 6:
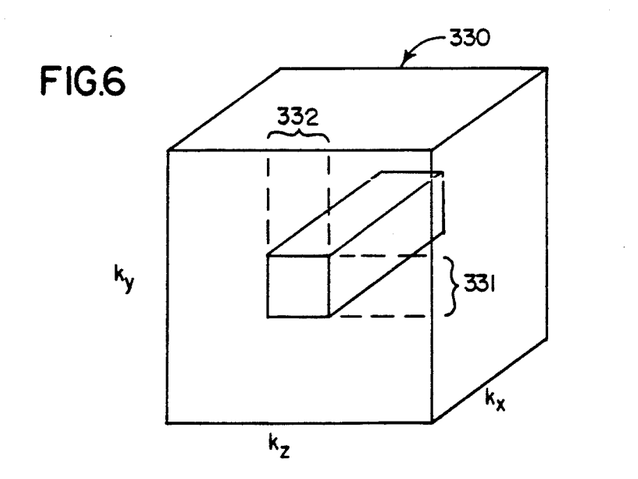
FIG. 6 is a schematic representation of a 3DFT data array acquired according to the present invention.

It should also be apparent that the present invention is also applicable to 3DFT scans. This is illustrated in FIG. 6 which depicts a three-dimensional image data array 330 containing digitized samples of NMR spin echo signals which contain both y-axis and z-axis phase encoding. To practice the present invention only low-order y-axis phase encoding views 331 and low-order z-axis phase encoding views 332 need be separately acquired for each separate image. The savings in total scan time in 3DFT acquisition is enormous.

It should also be apparent to those skilled in the art that the present invention may also be employed with other scan time reduction methods. For example, by using a homodyne image reconstruction technique as described in copending U.S. patent application Ser. No. 693,895, filed on May 1, 1991 and entitled "High Resolution Imaging Using Short TE and TR Pulse Sequences With Asymmetric NMR Echo Acquisition", the image arrays need not be completely filled with acquired data in order to reconstruct an image. Either partial echoes may be acquired or less than all phase encoding views may be acquired when using such a method to further reduce the total scan time.

While the present invention is preferably employed to produce two or more images in which their overall contrast is different as a result of $T_2$-weighting, the present invention may also be applied when a $T_2$-weighted difference in object edge enhancement is desired. This is achieved by acquiring separate views for each image which have the highest-order phase encoding possible. These highest-order views are acquired with different effect echo times TE such that the edges of tissues and fine structures are different in the two images. For example, in images with 256 phase encoding views, separate data for the lowest-order 64 views are acquired to provide a $T_2$-weighted difference in contrast, and separate data for the highest-order 64 views are acquired to provide a $T_2$-weighted difference in edge sharpness. The data for the remaining 128 high-order views is acquired only once and is shared by the image data sets used to reconstruct both images.

We claim:

1. An NMR system, the combination comprising:
   means for generating a polarizing magnetic field;
   excitation means for generating an RF excitation magnetic field which produces transverse magnetization in spins subjected to the polarizing magnetic field;
   receiver means for sensing a NMR signal produced by the transverse magnetization and producing digitized samples of the NMR signal;
   first gradient means for generating a first magnetic field gradient to phase encode the NMR signal;
   pulse control means coupled to the excitation means, first gradient means, and receiver means, said pulse control means being operable to conduct a scan in which a series of pulse sequences are conducted to acquire digitized samples of NMR signals which enable a plurality of images to be reconstructed;
   a set of image array storage means each coupled to the receiver means and each storing digitized samples of the NMR signals required to reconstruct one of said images;
   wherein each pulse sequence conducted during the scan produces a series of NMR signals that are acquired and each acquired NMR signal in the pulse sequence is separately phase encoded by said first gradient means, and each pulse sequence acquires a first NMR signal which has a first low-order phase encoding and is stored in one of said image array storage means, each pulse sequence acquires a second NMR signal which has a second low-order phase encoding and is stored in a second one of said image array storage means, and each pulse sequence acquires a third NMR signal which has a high-order phase encoding and is stored in both image array storage means.

2. The NMR system as recited in claim 1 in which the excitation means produces an RF excitation magnetic field pulse between each of said NMR signals in said pulse sequence, and each of said NMR signals is a spin echo NMR signal.

3. The NMR system as recited in claim 1 which includes second gradient means for generating a second magnetic field gradient that is directed substantially perpendicular to the first magnetic field gradient, and the second magnetic field gradient is produced as each NMR signal in the pulse sequence is, acquired.

4. The NMR system as recited in claim 1 in which each pulse sequence acquires a fourth NMR signal which has a highest-order phase encoding and is stored in said one of said image array storage means, and each pulse sequence acquires a fifth NMR signal which has a highest-order phase encoding and is stored in said second one of said image array storage means.

5. In an NMR system for acquiring NMR data during a scan and reconstructing images therefrom, a method for performing a fast spin echo pulse sequence to acquire NMR data from which a plurality of images can be reconstructed, the steps comprising:

generating an RF excitation pulse to produce transverse magnetization;

producing a series of NMR spin echo signals;

producing a series of phase encoding magnetic field gradient pulses interspersed with the NMR spin echo signals such that each NMR spin echo signal is phase encoded by an amount $k_y$ which ranges from zero to $\pm k_{max}$;

acquiring and digitizing each NMR spin echo signal;

storing the acquired NMR spin echo signals having a high amount of phase encoding in each of two image data arrays at locations therein corresponding to the amount of phase encoding $k_y$;

storing an acquired NMR spin echo signal for a first image which has a first low amount of phase encoding in the first of said two image data arrays at a location therein corresponding to the amount of phase encoding $k_y$;

storing an acquired NMR spin echo signal for a second image which has a second low amount of phase encoding in the second of said two image data arrays at a location therein corresponding to the amount of phase encoding $k_y$;

wherein at the completion of the scan the two image data arrays store the same acquired NMR data at locations corresponding to high-order phase encoding, and they store NMR data at locations corresponding to said first and second low-order phase encoding which are separately acquired from different ones of the series of NMR spin echo signals such that the two images reconstructed from the two image data arrays are different.

6. The method as recited in claim 5 which further includes:

storing an acquired NMR spin echo signal for the first image which has a highest amount of phase encoding in the first of said image data arrays at a location therein corresponding to the amount of phase encoding $k_y$; and storing an acquired NMR spin echo signal for the second image which also has said highest amount of phase encoding in the second of said two image data arrays at a location therein corresponding to the amount of phase encoding $k_y$.

* * * * *